United States Patent [19]

Davis et al.

[11] Patent Number: 5,164,330

[45] Date of Patent: Nov. 17, 1992

[54] ETCHBACK PROCESS FOR TUNGSTEN UTILIZING A NF3/AR CHEMISTRY

[75] Inventors: Rickie L. Davis, Aloha; Sohail U. Ahmed; Sridhar Balakrishnan, both of Portland, all of Oreg.

[73] Assignee: Intel Corporation, Santa Clara, Calif.

[21] Appl. No.: 686,683

[22] Filed: Apr. 17, 1991

[51] Int. Cl.$^5$ .......................................... H01L 21/283
[52] U.S. Cl. .................................. 437/192; 437/190; 437/228; 437/245; 156/643; 156/656; 156/651
[58] Field of Search ............... 437/192, 201, 228, 190, 437/187, 245, 246; 156/643, 656, 651, 650; 357/67

[56] References Cited

U.S. PATENT DOCUMENTS

| | | | |
|---|---|---|---|
| 4,713,141 | 12/1987 | Tsang | 156/643 |
| 4,884,123 | 11/1989 | Dixit et al. | 357/71 |
| 4,936,950 | 6/1990 | Doan et al. | 156/643 |
| 4,966,865 | 10/1990 | Welch et al. | 437/192 |
| 4,980,018 | 12/1990 | Mu et al. | 156/643 |
| 4,994,410 | 2/1991 | Sun et al. | 437/192 |
| 4,997,789 | 3/1991 | Keller et al. | 437/192 |
| 5,035,768 | 7/1991 | Mu et al. | 156/626 |
| 5,063,175 | 11/1991 | Broadbent | 437/192 |

OTHER PUBLICATIONS

Greene, W. M., D. W. Hess, and W. G. Oldham, Ion-Bombardment-Enhanced Plasma Etching of Tungsten with NF3/O2, *J. Vac. Sci. Technol.* B 6 (5), pp. 1570-1572, Sep./Oct. 1988.
Smith, Gregory C., CVD Tungsten Contact Plugs by In Situ Deposition and Etchback, *IEEE V-MIC Conf.* CH 2197-2, pp. 350-356, Jun. 25-26, 1985.
Chow, T. P., et al., "Plasma Etching of Refractory Gates...", J. Electrochem. Soc., vol. 131, No. 10, Oct. 1984, pp. 2325-2335.

*Primary Examiner*—T. N. Quach
*Attorney, Agent, or Firm*—Blakely, Sokoloff, Taylor & Zafman

[57] ABSTRACT

A process for etching a tungsten layer formed on a semiconductor substrate is described. The etch is carried out in a parallel plate plasma reactor. The etchant gases include nitrogen trifluoride ($NF_3$) and argon (Ar). The use of $NF_3$ in a tungsten etching process reduces the build-up of polymers or sulfur residues on the electrode as occurs with processes utilizing sulfur or carbon fluorides as etchant gases. The process has a sufficiently high etch rate for volume production. The $NF_3$-Ar etch process can be used to etchback a blanket layer of deposited tungsten to form tungsten via plugs in contact areas of the device. In the via plug process, reduced micro-loading effect, that is, the tendency of some plugs to be etched away before the complete etching of the blanket layer, has been achieved. The etching of tunsten with $NF_3$-Ar process can be preformed in one or more steps in process utilizing several etching steps. Additionally, a tungsten etch incorporating one or more $NF_3$-Ar steps and one or more steps utilizing etchants such as $SF_6$, $Cl_2$, $O_2$, $CF_4$, $CBrF_3$, $CF_3Cl$, $CF_2Cl_2$ or similar etchants can be used to optimize etch rate and uniformity while obtaining the benefit of reduced residue build-up.

42 Claims, 3 Drawing Sheets

ETCHBACK PROCESS FOR TUNGSTEN UTILIZING A NF3/AR CHEMISTRY

BACKGROUND OF THE PRESENT INVENTION

1. Field of the Invention.

This invention relates to the field of semiconductor devices and more specifically to an etchback process designed to etch a blanket layer of a refractory metal such as tungsten (W).

2. Prior Art.

In the manufacture of semiconductor devices, it is normally necessary to make contact to device regions underlying a dielectric on the surface of the silicon substrate. This is accomplished by first forming an opening or via (contact via) in the dielectric over the region to be contacted, and next filling the contact via with a conductive material.

In addition to filling the vias with a conductive material, it is necessary to electrically connect certain device regions with others, as well as to provide for electrical connection to external leads. These requirements are met by forming a wiring layer on the surface of the substrate. The wiring layer is formed by depositing a conductive material on top of the dielectric layer in which the vias have been formed. The conductive layer is then masked and etched to leave continuous lines of the conductive material necessary to make the appropriate connections to the device regions of the substrate. These lines are known as interconnects.

Several conductive materials can be used as a contact via fill. In larger geometry devices, the via fill and interconnect formation are accomplished simultaneously. Aluminum (Al) is deposited on the entire substrate, as well as in the vias. The areas over the vias and interconnects are then masked with photoresist and the aluminum is then etched from the remaining areas, leaving the vias filled with aluminum as well as forming interconnects on the surface of the dielectric layer.

As geometries have shrunk to submicron levels and devices have become more densely packed on the substrate surface, the openings or vias to the device regions to be contacted have increasingly greater aspect ratios (ratio of height to width). Aluminum deposition alone has proven to be inadequate in devices with high aspect ratios. The problems encountered include poor step coverage, poor contact integrity, and inadequate planarity.

To overcome these shortcomings, tungsten and other refractory metals are being used as a contact filling for devices with submicron contacts before aluminum deposition and patterning. For example, a blanket tungsten layer (tungsten "film") is deposited followed by a blanket etchback to remove deposited tungsten from the surface of the substrate, leaving a tungsten filling or plug in the contact openings or via. The aluminum layer is then deposited, covering the substrate surface including the filled contact vias. This aluminum film is then patterned and etched to form the interconnects.

One problem encountered with the tungsten process is the "micro-loading effect", where the tungsten etch rate drastically accelerates in the contact opening when the bulk of the film has been removed from the surface of the silicon substrate (that is, when the film "clears"). The result is that the contact fillings or plugs are recessed below the surface of the dielectric and are sometimes completely removed by the end of the etch. Because of the micro-loading effect, it is extremely difficult to obtain uniform contact fillings while ensuring that the bulk of the metal is completely removed from all other areas of the substrate surface. Slight non-uniformities in the metal thickness or etching process over the surface of the wafers will cause the bulk metal on the surface of the substrate to be etched in some areas of the substrate before others. If even a slight overetch is employed to ensure complete etching of the bulk metal from all areas of the surface, the metal filling the contact openings will begin to etch rapidly in those regions of the surface where the bulk metal clears first. This results in extreme variations or non-uniformities in the filling levels of the contact openings. The filling in the contact openings located in the area where the bulk metal cleared last will be completely unetched-that is, the contact openings in this area will be completely filled with tungsten, while the filling in the contact openings in areas where the bulk metal cleared earlier will be etched to different extents-some will be recessed slightly below the surface, others will be recessed to greater depths and some will be missing entirely.

A three step blanket etch process utilizing a timed etch in a gas mixture comprising sulfur hexafluoride ($SF_6$), oxygen ($O_2$) and helium (He), a second etch in a gas mixture comprising $SF_6$, chlorine ($Cl_2$) and He, and a short timed overetch in a gas mixture comprising $Cl_2$ and He is described in U.S. Pat. No. 4,980,018 entitled "Plasma Etching Process for Refractory Metal Vias", which patent is assigned to the assignee of the present invention. The above-referenced patent describes a process for overcoming the microloading effect and provides for complete etching of a blanket tungsten film while leaving the contacts uniformly filled with tungsten.

An additional problem in prior art processes is residue build-up on the reactor walls and electrode. The chemical make-up of the residue depends on the etchant gas used as well as the material being etched. Many prior art processes use etchant gases containing carbon such as $CF_4$, $CBrF_3$, $CF_3Cl$ and $CF_2Cl_2$ for example. These etchants are a source of carbon contamination. Many prior art processes use sulfur hexafluoride ($SF_6$) which causes the residue to contain sulfur. This in turn leads to the formation of $H_2S$ upon opening the reactor from the reaction of the sulfur in the residue with water in the air. The $H_2S$ has a pungent odor which is unpleasant for workers in the immediate area. It is also found that other non-volatile compounds, depending upon the metal etched, comprise part of the residue. For example, when etching titanium with the prior art processes, various oxides and halides of titanium are formed on the electrode.

In addition to the bad smell associated with the sulfur residue, the presence of any residue on the electrode degrades the systems performance. The residues clog the gas distribution holes which affects gas flow. Therefore, the residue must be scraped off of the electrode frequently, thereby increasing periodic maintenance requirements. In addition, this physical scraping of the residue reduces electrode life, increasing the upkeep cost for the system.

It has been noted that performing an etch in an RIE process using nitrogen trifluoride ($NF_3$) leaves no non-volatile residue. In "CVD Tungsten Contact Plugs by In Situ Deposition and Etchback", Gregory C. Smith, V-MIC conference, Jun. 25-26, 1988, a blanket CVD deposition of tungsten followed by an etch in $NF_3$ in an RIE system is described. Similarly, in "Ion-bombardment-enhanced plasma etching of tungsten with $NF_3/O_2$" W. N. Green et al., J. Vac. Sci. Technol. B6 (5), Sep/Oct 1988, a process using etchant gases of $NF_3$ and $O_2$ in RIE conditions in order to avoid surface residue is utilized to etch tungsten. However, RIE etching is in general not as manufactureable an etching process as other methods, primarily because of gate charging caused by the high DC bias of RIE.

Another problem encountered in etching refractory metals off of a dielectric is that the dielectric layer itself can be etched or otherwise degraded. One problem encountered is texturing or roughness of the dielectric surface caused by the tendency of the etch to replicate the tungsten film grain structure into the underlying dielectric surface. Other phenomena which occur to the dielectric surface include the formation of "spires" which are tall, thin (approximately 0.5 micron high and 0.1 micron in diameter) columns of tungsten remaining on the dielectric surface after the etch. These spires are probably caused by micromasking. A similar effect, called "grass" formation, is when the same type columns of the dielectric itself are formed, with no tungsten on top of the column of dielectric.

What is needed is a refractory metal etchback process that does not suffer from the micro-loading effect, does not add additional steps or complexities to the process, and has a sufficiently low throughput time to allow for high volume IC production. It is further desirable that the etch process minimizes residue formation on the reactor electrode, thereby reducing reactor maintenance requirements.

SUMMARY OF THE INVENTION

The present invention describes a process for filling contact vias by uniformly etching back a blanket refractory metal layer on a semiconductor substrate with minimal micro-loading effect in a parallel plate plasma reactor.

The etch proceeds in three steps. The first step is a timed etch utilizing a nitrogen trifluoride ($NF_3$) and argon (Ar) gas chemistry. This step removes approximately 50-60% of the refractory metal layer. The second step uses a gas chemistry of $NF_3$, chlorine ($Cl_2$) and Ar and proceeds until an endpoint is reached. The second step removes most of the remaining refractory metal layer from the surface of the semiconductor substrate. The third step uses a gas chemistry of $NF_3$, $Cl_2$ and Ar and is performed until a second endpoint is reached. The third etch step removes any remaining traces of refractory metal from the surface of the semiconductor surface.

The present invention uniformly etches a blanket refractory metal layer while leaving contact vias uniformly filled with the refractory metal. That is, the contact plugs are uniform with minimal plug recess. Use of the $NF_3/Ar$ etchant mixture is found to significantly reduce residue build-up on the reactor walls and electrode. In addition, the etch process does not significantly degrade the underlying dielectric surface by causing the formation of grass or spires as occurs with prior art etch processes.

The $NF_3/Ar$ etch process of the present invention can also be used as the first step in an etching process employing several steps. An $NF_3/Ar$ etch to remove the bulk of the metal can be followed by etch steps utilizing other etchants such as $SF_6$, $Cl_2$, $O_2$, $CF_4$, $CBrF_3$, $CF_3Cl$, $CF_2Cl_2$ or similar etchants to optimize etch rate and uniformity while obtaining the benefit of reduced residue buildup. For example, in an alternative embodiment of the invention, the timed $NF_3/AR$ bulk etch is followed by a second etch using a $SF_6/Cl_2/He$ chemistry until an endpoint is reached, and a third etch utilizing a $SF_6/Cl_2//He$ chemistry until a second endpoint is reached.

DETAILED DESCRIPTION OF THE PRESENT INVENTION

An invention is described for uniformly etching back a refractory metal film such as tungsten (W) from the surface of a semiconductor substrate leaving the contact openings or vias uniformly filled by tungsten. In the following description, numerous specific details are set forth such as specific thicknesses, etc. in order to provide a thorough understanding of the present invention. It will be obvious, however, to one skilled in the art, that the present invention may be practiced without these specific details. In other instances, well-known process steps have not been described in detail in order not to obscure unnecessarily the present invention.

Figure 1:
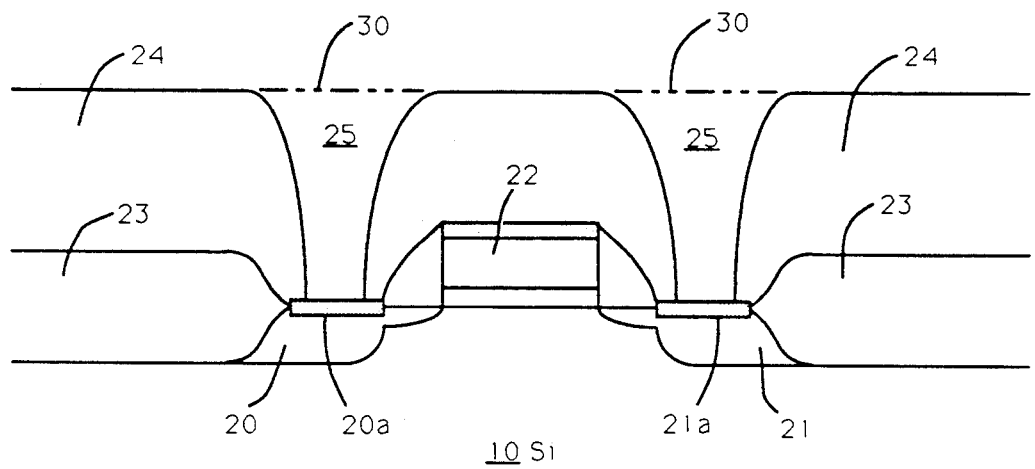
FIG. 1 is a cross-sectional elevation view of a device formed on a semiconductor substrate with dielectric layer formed thereon and contact openings formed through the dielectric layer.

FIG. 1 shows a cross-sectional elevation view of a portion of semiconductor substrate 10, upon which the present invention is practiced. The device shown in FIG. 1 is a typical MOS transistor. Region 20 is the source, region 21 is the drain, region 22 is the gate and region 23 is the field oxide. Also shown are contact regions 20a and 21a where contact is to be made to the active areas of the device. These contact regions can be, as shown, formed of a silicide. In addition gate 22 can be either heavily doped polysilicon or a silicide. Also shown in FIG. 1 is dielectric layer 24. Dielectric layer 24 may be, for example, silicon dioxide ($SiO_2$), silicon nitride ($Si_3N_4$), polyimide or a similar dielectric. In addition, dielectric layer 24 may comprise one or more dielectric layers. Also shown are vias or contact openings 25 formed in dielectric layer 24 to allow contact to the device regions 20 and 21 at the contact regions 20a and 21a. It will be appreciated that there are many such contact openings on the surface of the substrate 10, and only a small fraction of the substrate 10 is shown in the FIGS. 1, 2 and 5. The structure of FIG. 1 is formed using well-known prior art semiconductor processing techniques.

Although a specific MOS transistor is shown, it will be appreciated that the present invention can be practiced on any type of device where it is necessary to make electrical contact to underlying regions or layers. In addition, the blanket deposition and $NF_3/Ar$ etchback of the present invention can be used to fill contact openings which cut through more than one dielectric layer, as well as contact openings which expose other structures, such as a local interconnect line, a previous metal layer or a diffusion region in addition to device regions such as source 20 and drain 21. The contact openings other than those shown can be of a greater or lesser depth than those shown in FIGS. 1, 2 and 5.

Contact openings 25 are to be filled with tungsten so that electrical contact can be made to the underlying regions 20a and 21a. The width and depth of contact openings 25 are typically in the range of approximately 0.5 microns to 1.5 microns.

It is desirable to fill contact openings 25 to approximately the surface of the uppermost dielectric layer defining the opening. That is, the tungsten contact filling or plug in contact openings 25 should be approximately flush with the surface of dielectric layer 24 of FIG. 1 in the region of each contact opening. This is shown as dotted line 30 for contact openings 25 of FIG. 1. In practice, the contact fillings do not need to be perfectly flush with the surface of the uppermost dielectric layer (that is, the contact filling does not need to fill all the way up to line 30), but are acceptable from both a process and device perspective if recessed no more than 0.2 microns below, for example, line 30. Provided, however, the recesses are consistent. That is, all contact fillings over the entire surface of substrate 10 should be recessed no more than 0.2 microns.

Figure 2:
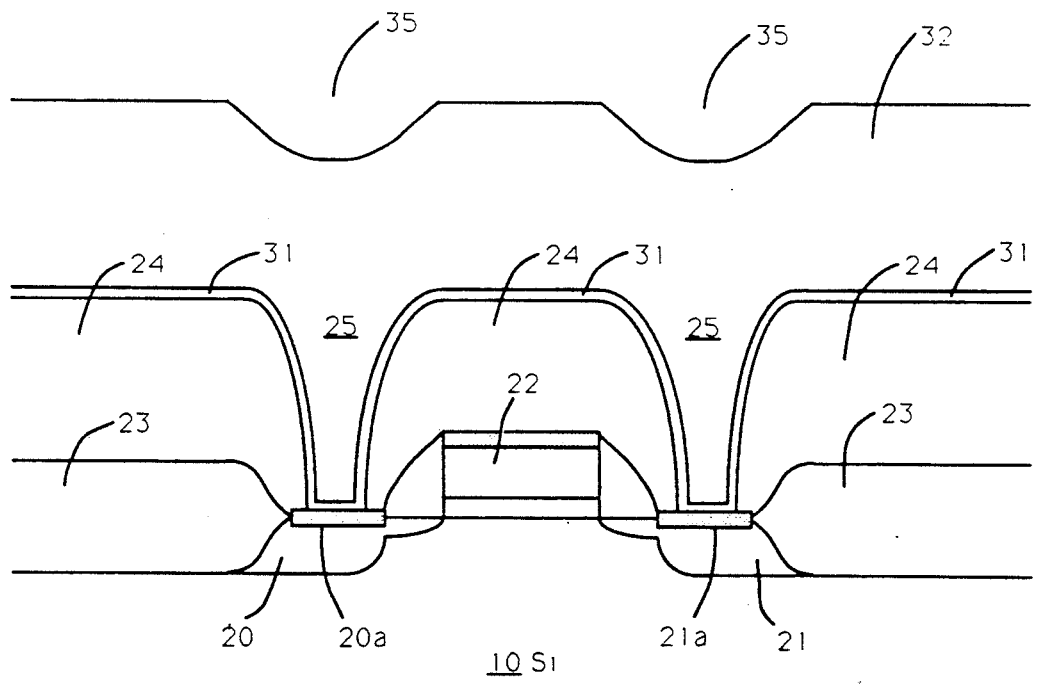
FIG. 2 illustrates the structure of FIG. 1 with an adhesion underlayer and a refractory metal layer formed thereon.

FIG. 2 shows the silicon substrate of FIG. 1 after deposition of an underlayer 31 and refractory metal layer 32. Underlayer 31 may be, for example, titanium (Ti), titanium tungsten (TiW) or titanium nitride (TiN). In the currently preferred embodiment, underlayer 31 is titanium nitride. The underlayer 31 is often referred to as an "adhesion" or "glue" layer. The thickness of underlayer 31 is in the range of approximately 400–1000 angstroms in the currently preferred embodiment. Typical thicknesses currently utilized for underlayer 31 range from approximately 450–900 Å for TiN, approximately 450–600 Å for Ti, and approximately 450 Å for TiW. The present invention has been practiced with the refractory metal layer 32 formed of tungsten, but it is anticipated that the present invention will give similar results for etching other refractory metals, with minor adjustments in operating parameters as can be performed by one of ordinary skill in the art. The thickness of tungsten layer 32 is generally in the range of 5000 to 20,000 angstroms and is typically about 10,000 angstroms in the currently preferred embodiment.

The deposited tungsten layer 32 of FIG. 2 is not planar but generally follows the contours of the surface. However, because of the small size of the contact openings 25, and because deposition occurs on the side walls of the contact openings 25 at the same time as deposition on the bottom, the tungsten deposition proceeds more quickly in the contact openings 25 than on the surface of substrate 10. The size of the resulting depressions 35 ("dimples") in the tungsten layer 32 over the contact openings 25 is therefore much smaller than the size of the contact openings 25 themselves. That is depressions 35 will not be as deep or as wide as the contact openings 25.

The tungsten layer 32 is next etched back. In general, the thickness of tungsten layer 32 is initially equal at all points on the surface, within the limits of deposition uniformity. That is, the thickness of tungsten layer 32 from the upper surface of the dielectric to the upper surface of the tungsten layer is approximately equal on all areas of substrate 10 with the minor variations due to depressions 35 as noted above and minor process variations. Therefore, when an etchback procedure is used that uniformly etches tungsten layer 32, the tungsten on the dielectric surfaces of substrate 10 will generally clear at approximately the same time in all areas of the substrate 10, and at the time of clearing the tungsten in the contact openings 25 will be approximately flush with the surrounding upper most dielectric layer.

Figure 3:
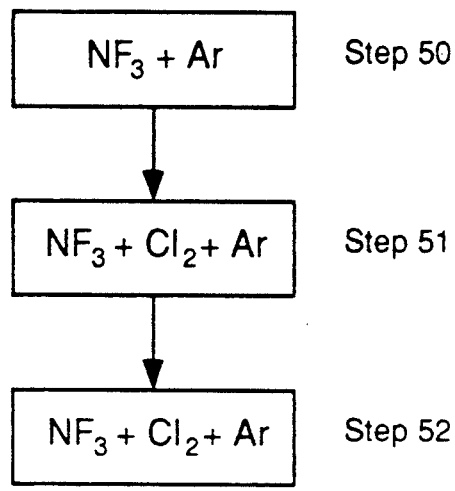
FIG. 3 illustrates the steps in the preferred embodiment of the novel etching process.

The present invention utilizes a three step etching process in the currently preferred embodiment, shown as steps 50, 51 and 52 in FIG. 3. In the following description numerous details including flow rates, pressures and power levels are given. It will be obvious to one skilled in the art however, that these parameters may be varied and still fall within the spirit and scope of the invention.

The etchback is carried out in the currently preferred process in a commercially available single wafer parallel plate plasma etcher such as the Lam Research Corporation Autoetch 490. The first step 50 of FIG. 3 uses a gas chemistry of $NF_3$ and Ar. In the currently preferred embodiment, the flow rate of $NF_3$ is approximately 90 standard cubic centimeters per minute (SCCM) and the flow rate of Ar is approximately 400 SCCM. Also in the currently preferred embodiment the process pressure is approximately 475 mTorr and the process power is approximately 380 W. The electrode distance (distance between the anode and cathode of the etcher) is approximately 0.55 cm. The above parameters may be varied within a certain range. The optimum operating parameters and the approximate range of acceptable operating parameters are set forth in Table 1 below. The optimum is set forth in the first column and approximate range in which the invention can be practiced is set forth in the second column. The first step 50 is a timed etch designed to remove 50%–60% of the total thickness of the tungsten layer 32. If tungsten layer 32 is deposited to a depth of 10,000 Å, the first step 50 will proceed for 1 minute and remove approximately 5,000 Å–6,000 Å. Therefore, after the first step 50 approximately 4,000 Å–5,000 Å will remain. In practice, a uniformity of approximately 3% (1 sigma) variation across the wafer has been achieved in step 50.

The second step 51 of FIG. 3 is performed immediately following the first etch (step 50 of FIG. 3), without removing the substrate 10 from the etcher chamber in the currently preferred embodiment. The gas chemistry in the second etch is $NF_3$, $Cl_2$ and Ar. In the currently preferred embodiment, the flow rate of $NF_3$ is approximately 60 SCCM, the flow rate of $Cl_2$ is approximately 60 SCCM, and the flow rate of Ar is approximately 250 SCCM. Also in the currently preferred embodiment the process pressure is approximately 540 mTorr and the process power is approximately 340 W. The electrode distance is approximately 0.9 cm. The optimum operating parameters and the approximate range of operating parameters for the currently preferred process are set forth in Table 2 below. In the currently preferred embodiment the second step 51 is designed to remove the remaining tungsten layer 32, and is therefore carried out until an endpoint is reached. The endpoint is determined using a commercially available endpoint detector such as the Xinix 1014 endpoint controller. In the second step 51, the endpoint is triggered on a signal rise. The etch rate of the second step 51 is approximately 2,000 Å/minute in the currently preferred embodiment. This second step 51 uses a lower power than the first step 50. This lower power reduces the etch rate of the second step 51 compared with the first step 50. However, the use of a lower power reduces the micro-loading effect. In practice, a uniformity of approximately 1.5% (1 sigma) variation across the wafer has been achieved.

Normally, it is possible for the endpoint to be detected when there is still a slight amount of metal on some areas of the surface of substrate 10 from underlayer 31 or tungsten layer 32 which may cause shorts between contacts. In many prior art processes, the etch is allowed to proceed beyond the detected endpoint. This has the disadvantage that the tungsten in contact openings located in areas of substrate 10 where the metal layer 32 has cleared will continue to etch, usually at a rapid rate.

In the present invention, a third short etch (step 52 of FIG. 3) using a chemistry and process parameters which do not etch tungsten very rapidly is performed immediately following the second etch (step 51 of FIG. 3), without removing the substrate 10 from the etcher chamber in the currently preferred embodiment. The third step 52 is performed until a second endpoint is reached. The endpoint for this step is triggered on a signal drop. The gas chemistry in the third etch step 52 is $NF_3$, $Cl_2$ and Ar. In the currently preferred embodiment, the flow rate of $NF_3$ is approximately 25 SCCM, the flow rate of $Cl_2$ is approximately 77 SCCM, and the flow rate of Ar is approximately 180 SCCM. Also in the currently preferred embodiment the process pressure is approximately 400 mTorr and the process power is approximately 190 W. The electrode distance is approximately 1.0 cm. The optimum operating parameters and the range of operating parameters for the currently preferred process are set forth in Table 3 below.

The micro-loading effect is greatly reduced in the above three step etch compared with prior art etching processes utilizing $SF_6/O_2$ etchants for example.

The three step process of the present invention is designed to provide a high throughput etch process with minimal micro-loading effect and minimal residue build-up on the electrode and walls of the reactor. Depending on device, process and equipment requirements, alternative embodiments of the present invention can be utilized and still obtain the objects of the present invention. The following alternative embodiment is by way of illustration only, and it will be appreciated that many such alternative embodiments utilizing the $NF_3/Ar$ step or the $NF_3/Cl_2/Ar$ step of the present invention alone or together with one or more additional steps using these or other prior art etchants can be employed to remove a portion of a tungsten layer.

Figure 4:
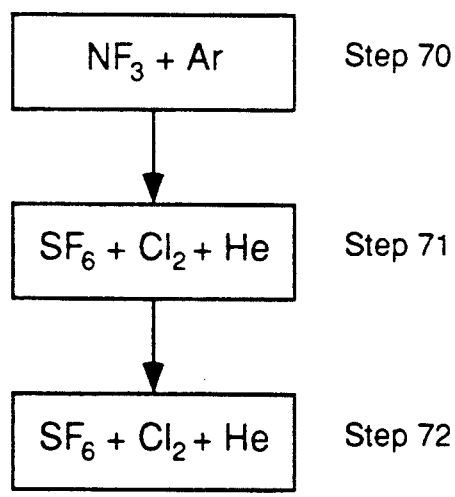
FIG. 4 illustrates the steps in an alternative embodiment of the novel etching process.

FIG. 4 shows an alternative embodiment of the present invention. The first etch step 70 of the alternative embodiment is carried out in $NF_3$ and Ar. In the alternative embodiment shown in FIG. 4, the first etch step 70 is a timed etch designed to remove about 50-60 percent of the thickness of tungsten layer 32. The second step 71 of the alternative embodiment is carried out in $SF_6$, $Cl_2$ and He until an endpoint is reached. The third step 72 of the alternative embodiment is a short etch carried out in $SF_6$, $Cl_2$ and He until a second endpoint is reached. The parameters for the first step 70, the second step 71 and the third step 72 of the alternative embodiment are given in Tables 6, 7 and 8 respectively. Utilizing this alternative embodiment has the advantage of very repeatable endpoints for the second and third etches, steps 71 and 72. However, the alternative embodiment results in more polymer build-up than occurs in a completely $SF_6$-free process.

Figure 5:
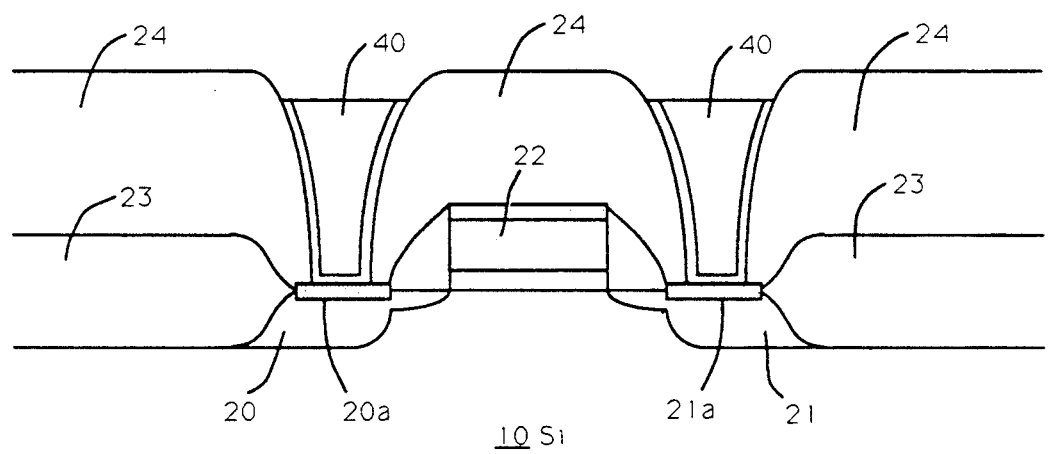
FIG. 5 illustrates the structure of FIG. 2 after etchback of the metal layer and adhesion underlayer from the surface of the dielectric, leaving the contact openings filled with the refractory metal.

After the etch steps of the preferred or alternative embodiments as described above, the semiconductor substrate 10 appears as is shown in FIG. 5. The contact openings 25 are now filled with contact fill 40. Contact fill 40 is made of the materials used to form underlayer 31 and refractory metal layer 32 of FIG. 2. In the current preferred and alternative embodiments, contact fill 40 is therefore made mostly of tungsten with a thin layer of titanium nitride as shown in FIG. 6. In some of the contact openings 25 the contact fill 40 may be, as shown in FIG. 6, recessed slightly below the surface of dielectric layer 24. In general, the depth of the recession is less than 0.2 microns over the entire surface of the wafer. That is, extremely good uniformity in contact filling is achieved.

The above etch processes describe the currently preferred and alternative embodiments of the present invention. It will be obvious, however, that it is not necessary to practice all of the above steps to achieve the objects of the invention. For example, use of an etch step utilizing an $NF_3$ and Ar gas chemistry to etch the bulk of a tungsten film in a process using etch steps with other etchant gases such as $SF_6$, $Cl_2$, $O_2$, $CF_4$, $CBrF_3$, $CF_3Cl$, $CF_2Cl_2$ or similar etchants will result in less residue build-up than that which would occur in an etch process utilizing these same etchants to etch the entire tungsten layer. Additionally, in a process utilizing a Ti, TiW or TiN underlayer and a tungsten metal layer to form the contact filling, the use of a final etch step utilizing a gas chemistry of $NF_3$, $Cl_2$ and He, along with the process parameters given in Table 2, will reduce overetch of the tungsten contact filling compared with the prior art technique of performing an overetch utilizing the same gases and parameters as were used in the etch which removed the bulk of the metal layer.

In the present invention, the chemistry of $NF_3$ and Ar during the first etch step 50 etches the bulk of tungsten layer 32 uniformly. The second etch step 51 etches most of the remainder of tungsten layer 32 and titanium nitride layer 31 while leaving the contact openings 25 filled with tungsten. The third etch step 52 removes any remaining portions of tungsten layer 32 as well as underlayer 31. The gas chemistry used in this step selectively etches Ti, TiW or TiN over tungsten, and therefore underlayer 31 will be etched more quickly than the tungsten forming the contact fillings, further resulting in uniformity of the contact fillings.

All etch steps in the currently preferred and alternative embodiments are carried out in a parallel plate plasma reactor. The $NF_3/Ar$ chemistry of the present invention leads to minimal residue build-up on the reactor electrode compared with prior art processes.

Thus, a novel etchback technique for etching a tungsten layer uniformly in a parallel plate reactor is described.

TABLE 1

| FIRST STEP PARAMETERS, PREFERRED EMBODIMENT | | |
|---|---|---|
| | Optimum | Range |
| $NF_3$ flow | 90 SCCM | 50-150 SCCM |
| Ar flow | 400 SCCM | 300-500 SCCM |
| Process Pressure | 475 mTorr | 350-600 mTorr |
| Process Power | 380 W | 325-425 W |
| Electrode Distance | 0.55 cm | 0.45-0.70 cm |

TABLE 2

SECOND STEP PARAMETERS, PREFERRED EMBODIMENT

|  | Optimum | Range |
|---|---|---|
| NF$_3$ flow | 60 SCCM | 40-80 SCCM |
| Cl$_2$ flow | 60 SCCM | 40-80 SCCM |
| Ar flow | 250 SCCM | 200-300 SCCM |
| Process Pressure | 540 mTorr | 450-600 mTorr |
| Process Power | 340 W | 250-400 W |
| Electrode Distance | 0.9 cm | 0.70-1.10 cm |

TABLE 3

THIRD STEP PARAMETERS, PREFERRED EMBODIMENT

|  | Optimum | Range |
|---|---|---|
| NF$_3$ flow | 25 SCCM | 20-30 SCCM |
| Cl$_2$ flow | 77 SCCM | 70-85 SCCM |
| Ar flow | 180 SCCM | 150-200 SCCM |
| Process Pressure | 400 mTorr | 350-550 mTorr |
| Process Power | 190 W | 175-200 W |
| Electrode Distance | 1.0 cm | 0.90-1.40 cm |

TABLE 4

FIRST STEP PARAMETERS, ALTERNATIVE EMBODIMENT

|  | Optimum | Range |
|---|---|---|
| NF$_3$ flow | 90 SCCM | 50-150 SCCM |
| Ar flow | 400 SCCM | 300-500 SCCM |
| Process Pressure | 475 mTorr | 350-600 mTorr |
| Process Power | 380 W | 325-425 W |
| Electrode Distance | 0.55 cm | 0.45-0.70 cm |

TABLE 5

SECOND STEP PARAMETERS, ALTERNATIVE EMBODIMENT

|  | Optimum | Range |
|---|---|---|
| SF$_6$ flow | 75 SCCM | 50-100 SCCM |
| Cl$_2$ flow | 45 SCCM | 35-60 SCCM |
| He flow | 150 SCCM | 100-200 SCCM |
| Process Pressure | 475 mTorr | 350-550 mTorr |
| Process Power | 320 W | 250-400 W |
| Electrode Distance | 0.65 cm | 0.50-0.90 cm |

TABLE 6

THIRD STEP PARAMETERS, ALTERNATIVE EMBODIMENT

|  | Optimum | Range |
|---|---|---|
| SF$_3$ flow | 20 SCCM | 15-25 SCCM |
| Cl$_2$ flow | 40 SCCM | 35-45 SCCM |
| He flow | 100 SCCM | 75-150 SCCM |
| Process Pressure | 450 mTorr | 350-550 mTorr |
| Process Power | 155 W | 150-175 W |
| Electrode Distance | 1.10 cm | 0.90-1.40 cm |

We claim:

1. A process for etching a refractory metal layer in a parallel plate reactor during the fabrication of a device on a semiconductor substrate, said process comprising the steps of:
   providing said substrate having said refractory metal layer; and
   exposing said substrate to a first plasma formed in a flow of a first mixture comprising NF$_3$ and a first inert gas, wherein said flow of said NF$_3$ in said first mixture is in the range of approximately 50-150 Standard Cubic Centimeters per Minute (SCCM), said flow of said first inert gas in said first mixture is in the range of approximately 300-500 SCCM, said first plasma is formed at a power in the range of approximately 325-425 Watts and at a pressure in the range of approximately 350-600 mTorr.

2. The process as described in claim 1 wherein said first inert gas is argon.

3. The process as described in claim 1 wherein said exposure to said first plasma proceeds for a predetermined time.

4. The process as described in claim 1 wherein said refractory metal layer comprises a tungsten layer.

5. The process as described in claim 4 wherein said first inert gas is argon.

6. The process as described in claim 4 wherein said exposure to said first plasma proceeds for a predetermined time.

7. The process as described in claim 5 wherein said exposure to said first plasma proceeds for a predetermined time.

8. A process for etching a refractory metal layer and an adhesion metal layer disposed beneath said refractory metal layer in a parallel plate reactor during the fabrication of a device on a semiconductor substrate, said process comprising the steps of:
   providing said substrate having said refractory metal layer and said adhesion underlayer;
   exposing said substrate to a first plasma formed in a flow of a first mixture comprising NF$_3$ and a first inert gas;
   exposing said substrate to a second plasma formed in a flow of a second mixture comprising NF$_3$, Cl$_2$ and a second inert gas; and
   exposing said substrate to a third plasma formed in a flow of a third mixture comprising NF$_3$, Cl$_2$ and a third inert gas.

9. The process as described in claim 8 wherein said exposure to said first plasma proceeds for a predetermined time, said exposure to said second plasma proceeds until a first endpoint is reached, said first endpoint being triggered when substantially all of said refractory metal layer has been removed, and said exposure to said third plasma proceeds until a second endpoint is reached, said second endpoint being triggered when substantially all of said adhesion metal layer has been removed.

10. The process as described in claim 8 wherein said NF$_3$ in said first mixture has a flow rate in the range of approximately 50-150 Standard Cubic Centimeters per Minute (SCCM), said first inert gas in said first mixture has a flow rate in the range of approximately 300-500 SCCM, said NF$_3$ in said second mixture has a flow rate in the range of approximately 40-80 SCCM, said Cl$_2$ in said second mixture has a flow rate in the range of approximately 40-80 SCCM, said second inert gas in said second mixture has a flow rate in the range of approximately 200-300 SCCM, said NF$_3$ in said third mixture has a flow rate in the range of approximately 20-30 SCCM, said Cl$_2$ in said third mixture has a flow rate in the range of approximately 70-85 SCCM, and said third inert gas in said third mixture has a flow rate in the range of approximately 150-200 SCCM.

11. The process as described in claim 10 wherein said first plasma is formed at a power in the range of approximately 325-425 Watts and a pressure in the range of approximately 350-600 mTorr, said second plasma is formed at a power in the range of approximately 250-400 Watts and a pressure in the range of approximately 450-600 mTorr, and said third plasma is formed at a power in the range of approximately 175-200 Watts and a pressure in the range of approximately 350-550 mTorr.

12. The process as described in claim 8 wherein said refractory metal layer comprises tungsten and said adhesion layer is selected from the group consisting of titanium, titanium nitride and titanium tungsten.

13. The process as described in claim 12 wherein said exposure to said first plasma proceeds for a predetermined time, said exposure to said second plasma proceeds until a first endpoint is reached, said first endpoint being triggered when substantially all of said refractory metal layer has been removed, and said exposure to said third plasma proceeds until a second endpoint is reached, said second endpoint being triggered when substantially all of said adhesion metal layer has been removed.

14. The process as described in claim 12 wherein said $NF_3$ in said first mixture has a flow rate in the range of approximately 50-150 Standard Cubic Centimeters per Minute (SCCM), said first inert gas in said first mixture has a flow rate in the range of approximately 300-500 SCCM, said $NF_3$ in said second mixture has a flow rate in the range of approximately 40-80 SCCM, said $Cl_2$ in said second mixture has a flow rate in the range of approximately 40-80 SCCM, said second inert gas in said second mixture has a flow rate in the range of approximately 200-300 SCCM, said $NF_3$ in said third mixture has a flow rate in the range of approximately 20-30 SCCM, said $Cl_2$ in said third mixture has a flow rate in the range of approximately 70-85 SCCM, and said third inert gas in said third mixture has a flow rate in the range of approximately 150-200 SCCM.

15. The process as described in claim 14 wherein said exposure to said first plasma proceeds for a predetermined time, said exposure to said second plasma proceeds until a first endpoint is reached, said first endpoint being triggered when substantially all of said refractory metal layer has been removed, and said exposure to said third plasma proceeds until a second endpoint is reached, said second endpoint being triggered when substantially all of said adhesion metal layer has been removed.

16. The process as described in claim 14 wherein said first plasma is formed at a power in the range of approximately 325-425 Watts and a pressure in the range of approximately 350-600 mTorr, said second plasma is formed at a power in the range of approximately 250-400 Watts and a pressure in the range of approximately 450-600 mTorr, and said third plasma is formed at a power in the range of approximately 175-200 Watts and a pressure in the range of approximately 350-550 mTorr.

17. The process as described in claim 16 wherein said exposure to said first plasma proceeds for a predetermined time, said exposure to said second plasma proceeds until a first endpoint is reached, said first endpoint being triggered when substantially all of said refractory metal layer has been removed, and said exposure to said third plasma proceeds until a second endpoint is reached, said second endpoint being triggered when substantially all of said adhesion metal layer has been removed.

18. The process as described in claim 8, 12, 10, 14, 11 or 16 wherein said first inert gas is argon, said second inert gas is argon and said third inert gas is argon.

19. A process for filling openings in a dielectric layer formed on a substrate, said openings exposing a plurality of underlying regions on said substrate, said process comprising the steps of:
providing said substrate with said dielectric layer formed thereon;
depositing a refractory metal layer on said dielectric layer and said underlying regions to substantially cover said dielectric layer and said underlying regions and to substantially fill said openings;
etching said refractory metal layer overlying said dielectric layer in a parallel plate reactor by a method comprising the step of:
exposing said substrate to a plasma formed in a flow of a first mixture comprising $NF_3$ and a first inert gas, wherein said flow of said $NF_3$ in said first mixture is in the range of approximately 50-150 Standard Cubic Centimeters per Minute (SCCM), said flow of said first inert gas in said first mixture is in the range of approximately 300-500 SCCM, said first plasma is formed at a power in the range of approximately 325-425 Watts and at a pressure in the range of approximately 350-600 mTorr.

20. The process as described in claim 19 wherein said exposure to said first plasma proceeds for a predetermined time.

21. The process as described in claim 19 wherein said refractory metal layer comprises a tungsten layer.

22. The process as described in claim 21 wherein said exposure to said first plasma proceeds for a predetermined time.

23. The process as described in claim 19 or 21 wherein said first inert gas is argon.

24. A process for filling openings in a dielectric layer formed on a substrate, said openings exposing a plurality of underlying regions on said substrate, said process comprising the steps of:
providing said substrate having said dielectric layer;
depositing an adhesion layer on said dielectric layer and said underlying regions to substantially cover said dielectric layer and said underlying regions;
depositing a refractory metal layer on said adhesion layer to substantially cover said adhesion layer and to substantially fill said openings;
etching said refractory metal layer and said adhesion layer overlying said dielectric layer in a parallel plate reactor by a method comprising the steps of;
exposing said substrate to a first plasma formed in a flow of a first mixture comprising $NF_3$ and a first inert gas;
exposing said substrate to a second plasma formed in a flow of a second mixture comprising $NF_3$, $Cl_2$ and a second inert gas; and
exposing said substrate to a third plasma formed in a flow of a third mixture comprising $NF_3$, $Cl_2$ and a third inert gas.

25. The process as described in claim 24 wherein said exposure to said first plasma proceeds for a predetermined time, said exposure to said second plasma proceeds until a first endpoint is reached, said first endpoint being triggered when substantially all of said refractory metal layer overlying said dielectric layer has been removed, and said exposure to said third plasma proceeds until a second endpoint is reached, said second endpoint being triggered when substantially all of said adhesion metal layer overlying said dielectric layer has been removed.

26. The process as described in claim 24 wherein said $NF_3$ in said first mixture has a flow rate in the range of approximately 50-150 Standard Cubic Centimeters per Minute (SCCM), said first inert gas in said first mixture has a flow rate in the range of approximately 300–500 SCCM, said $NF_3$ in said second mixture has a flow rate in the range of approximately 40–80 SCCM, said $Cl_2$ in said second mixture has a flow rate in the range of approximately 40–80 SCCM, said second inert gas in said second mixture has a flow rate in the range of approximately 200–300 SCCM, said $NF_3$ in said third mixture has a flow rate in the range of approximately 20–30 SCCM, said $Cl_2$ in said third mixture has a flow rate in the range of approximately 70–85 SCCM, and said third inert gas in said third mixture has a flow rate in the range of approximately 150–200 SCCM.

27. The process as described in claim 26 wherein said first plasma is formed at a power in the range of approximately 325–425 Watts and a pressure in the range of approximately 350–600 mTorr, said second plasma is formed at a power in the range of approximately 250–400 Watts and a pressure in the range of approximately 450–600 mTorr, and said third plasma is formed at a power in the range of approximately 175–200 Watts and a pressure in the range of approximately 350–550 mTorr.

28. The process as described in claim 24 wherein said refractory metal layer comprises tungsten and said adhesion layer is selected from the group consisting of titanium, titanium nitride and titanium tungsten.

29. The process as described in claim 28 wherein said exposure to said first plasma proceeds for a predetermined time, said exposure to said second plasma proceeds until a first endpoint is reached, said first endpoint being triggered when substantially all of said refractory metal layer overlying said dielectric layer has been removed, and said exposure to said third plasma proceeds until a second endpoint is reached, said second endpoint being triggered when substantially all of said adhesion metal layer overlying said dielectric layer has been removed.

30. The process as described in claim 28 wherein said $NF_3$ in said first mixture has a flow rate in the range of approximately 50–150 Standard Cubic Centimeters per Minute (SCCM), said first inert gas in said first mixture has a flow rate in the range of approximately 300–500 SCCM, said $NF_3$ in said second mixture has a flow rate in the range of approximately 40–80 SCCM, said $Cl_2$ in said second mixture has a flow rate in the range of approximately 40–80 SCCM, said second inert gas in said second mixture has a flow rate in the range of approximately 200–300 SCCM, said $NF_3$ in said third mixture has a flow rate in the range of approximately 20–30 SCCM, said $Cl_2$ in said third mixture has a flow rate in the range of approximately 70–85 SCCM, and said third inert gas in said third mixture has a flow rate in the range of approximately 150–200 SCCM.

31. The process as described in claim 30 wherein said first plasma is formed at a power in the range of approximately 325–425 Watts and a pressure in the range of approximately 350–600 mTorr, said second plasma is formed at a power in the range of approximately 250–400 Watts and a pressure in the range of approximately 450–600 mTorr, and said third plasma is formed at a power in the range of approximately 175–200 Watts and a pressure in the range of approximately 350–550 mTorr.

32. The process as described in claim 31 wherein said exposure to said first plasma proceeds for a predetermined time, said exposure to said second plasma proceeds until a first endpoint is reached, said first endpoint being triggered when substantially all of said refractory metal layer overlying said dielectric layer has been removed, and said exposure to said third plasma proceeds until a second endpoint is reached, said second endpoint being triggered when substantially all of said adhesion metal layer overlying said dielectric layer has been removed.

33. The process as described in claim 30 wherein said exposure to said first plasma proceeds for a predetermined time, said exposure to said second plasma proceeds until a first endpoint is reached, said first endpoint being triggered when substantially all of said refractory metal layer overlying said dielectric layer has been removed, and said exposure to said third plasma proceeds until a second endpoint is reached, said second endpoint being triggered when substantially all of said adhesion metal layer overlying said dielectric layer has been removed.

34. The process as described in claim 24, 28, 26, 30, 27 or 31 wherein said first inert gas is argon, said second inert gas is argon and said third inert gas is argon.

35. The process as described in claim 34 wherein said exposure to said first plasma proceeds for a predetermined time, said exposure to said second plasma proceeds until a first endpoint is reached, said first endpoint being triggered when substantially all of said refractory metal layer overlying said dielectric layer has been removed, and said exposure to said third plasma proceeds until a second endpoint is reached, said second endpoint being triggered when substantially all of said adhesion metal layer overlying said dielectric layer has been removed.

36. A process for etching a refractory metal layer and an adhesion metal layer disposed beneath said refractory metal layer in a parallel plate reactor during the fabrication of a device on a semiconductor substrate, said process comprising the steps of:
providing said substrate having said refractory metal layer and said adhesion underlayer,
etching said refractory metal layer and said adhesion layer overlying said dielectric layer in a parallel plate reactor by a method comprising the steps of:
exposing said substrate to a first plasma formed in a flow of a first mixture comprising $NF_3$ and a first inert gas;
exposing said substrate to a second plasma formed in a flow of a second mixture comprising $SF_6$, $Cl_2$ and a second inert gas; and
exposing said substrate to a third plasma formed in a flow of a third mixture comprising $SF_6$, $Cl_2$ and a third inert gas.

37. The process as described in claim 36 wherein said refractory metal layer comprises tungsten and said adhesion layer is selected from the group consisting of titanium, titanium nitride and titanium tungsten.

38. The process as described in claim 37 wherein said $NF_3$ in said first mixture has a flow rate in the range of approximately 50–150 Standard Cubic Centimeters per Minute (SCCM), said first inert gas in said first mixture has a flow rate in the range of approximately 300–500 SCCM, said $SF_6$ in said second mixture has a flow rate in the range of approximately 50–100 SCCM, said $Cl_2$ in said second mixture has a flow rate in the range of approximately 35–60 SCCM, said second inert gas in said second mixture has a flow rate in the range of approximately 100–200 SCCM, said $SF_6$ in said third mixture has a flow rate in the range of approximately 15–25 SCCM, said $Cl_2$ in said third mixture has a flow rate in the range of approximately 35-45 SCCM, and said third inert gas in said third mixture has a flow rate in the range of approximately 75-150 SCCM.

39. The process as described in claim 38 wherein said first plasma is formed at a power in the range of approximately 325-425 Watts and a pressure in the range of approximately 350-600 mTorr, said second plasma is formed at a power in the range of approximately 250-400 Watts and a pressure in the range of approximately 350-550 mTorr, and said third plasma is formed at a power in the range of approximately 150-175 Watts and a pressure in the range of approximately 350-550 mTorr.

40. The process as described in claim 36 wherein said $NF_3$ in said first mixture has a flow rate in the range of approximately 50-150 Standard Cubic Centimeters per Minute (SCCM), said first inert gas in said first mixture has a flow rate in the range of approximately 300-500 SCCM, said $SF_6$ in said second mixture has a flow rate in the range of approximately 50-100 SCCM, said $Cl_2$ in said second mixture has a flow rate in the range of approximately 35-60 SCCM, said second inert gas in said second mixture has a flow rate in the range of approximately 100-200 SCCM, said $SF_6$ in said third mixture has a flow rate in the range of approximately 15-25 SCCM, said $Cl_2$ in said third mixture has a flow rate in the range of approximately 35-45 SCCM, and said third inert gas in said third mixture has a flow rate in the range of approximately 75-150 SCCM.

41. The process as described in claim 40 wherein said first plasma is formed at a power in the range of approximately 325-425 Watts and a pressure in the range of approximately 350-600 mTorr, said second plasma is formed at a power in the range of approximately 250-400 Watts and a pressure in the range of approximately 350-550 mTorr, and said third plasma is formed at a power in the range of approximately 150-175 Watts and a pressure in the range of approximately 350-550 mTorr.

42. The process as described in claim 36, 37, 40, 38, 41 or 39 wherein said first inert gas is argon, said second inert gas is helium and said third inert gas is helium.

* * * * *

UNITED STATES PATENT AND TRADEMARK OFFICE
CERTIFICATE OF CORRECTION

PATENT NO. : 5,164,330
DATED : 11/17/92
INVENTOR(S) : Rickie L. Davis, et al

It is certified that error appears in the above-indentified patent and that said Letters Patent is hereby corrected as shown below:

TITLE PAGE:

[57]   Abstract, Line 15   Delete "tunsten"          Insert --tungsten--

| | | |
|---|---|---|
| Col. 9, Line 48  | Delete "SF$_3$" | Insert --SF$_6$-- |
| Col. 11, Line 34 | Delete "14"     | Insert --12--     |
| Col. 11, Line 54 | Delete "16"     | Insert --14--     |
| Col. 13, Line 65 | Delete "31"     | Insert --30--     |
| Col. 14, Line 8  | Delete "30"     | Insert --31--     |
| Col. 14, Line 56 | Delete "37"     | Insert --36--     |

Signed and Sealed this

Eleventh Day of July, 1995

Attest:

BRUCE LEHMAN

*Attesting Officer*         *Commissioner of Patents and Trademarks*